(12) United States Patent
Chuang et al.

(10) Patent No.: US 8,691,673 B2
(45) Date of Patent: Apr. 8, 2014

(54) SEMICONDUCTOR STRUCTURE WITH SUPPRESSED STI DISHING EFFECT AT RESISTOR REGION

(75) Inventors: Hak-Lay Chuang, Hsinchu (TW); Ming Zhu, Singapore (SG); Lee-Wee Teo, Singapore (SG); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 147 days.

(21) Appl. No.: 13/115,488

(22) Filed: May 25, 2011

(65) Prior Publication Data

US 2012/0299115 A1    Nov. 29, 2012

(51) Int. Cl.
 *H01L 21/00* (2006.01)
(52) U.S. Cl.
 USPC ............... 438/506; 438/514; 257/E21.057

(58) Field of Classification Search
 USPC ................ 438/531, 506, 514; 257/E21.057
 See application file for complete search history.

(56) References Cited

U.S. PATENT DOCUMENTS

| 2006/0017117 A1* | 1/2006 | Kotani ........................... 257/379 |
| 2008/0093699 A1* | 4/2008 | Abe et al. ..................... 257/499 |

* cited by examiner

*Primary Examiner* — Julio J Maldonado
*Assistant Examiner* — Amar Movva
(74) *Attorney, Agent, or Firm* — Haynes and Boone, LLP

(57) ABSTRACT

A method includes forming a first isolation feature of a first width and a second isolation feature of a second width in a substrate, the first width being substantially greater than the second width; forming an implantation mask on the substrate, wherein the implantation mask covers the first isolation feature and exposes the second isolation feature; performing an ion implantation process to the substrate using the implantation mask; and thereafter performing an etching process to the substrate.

18 Claims, 12 Drawing Sheets

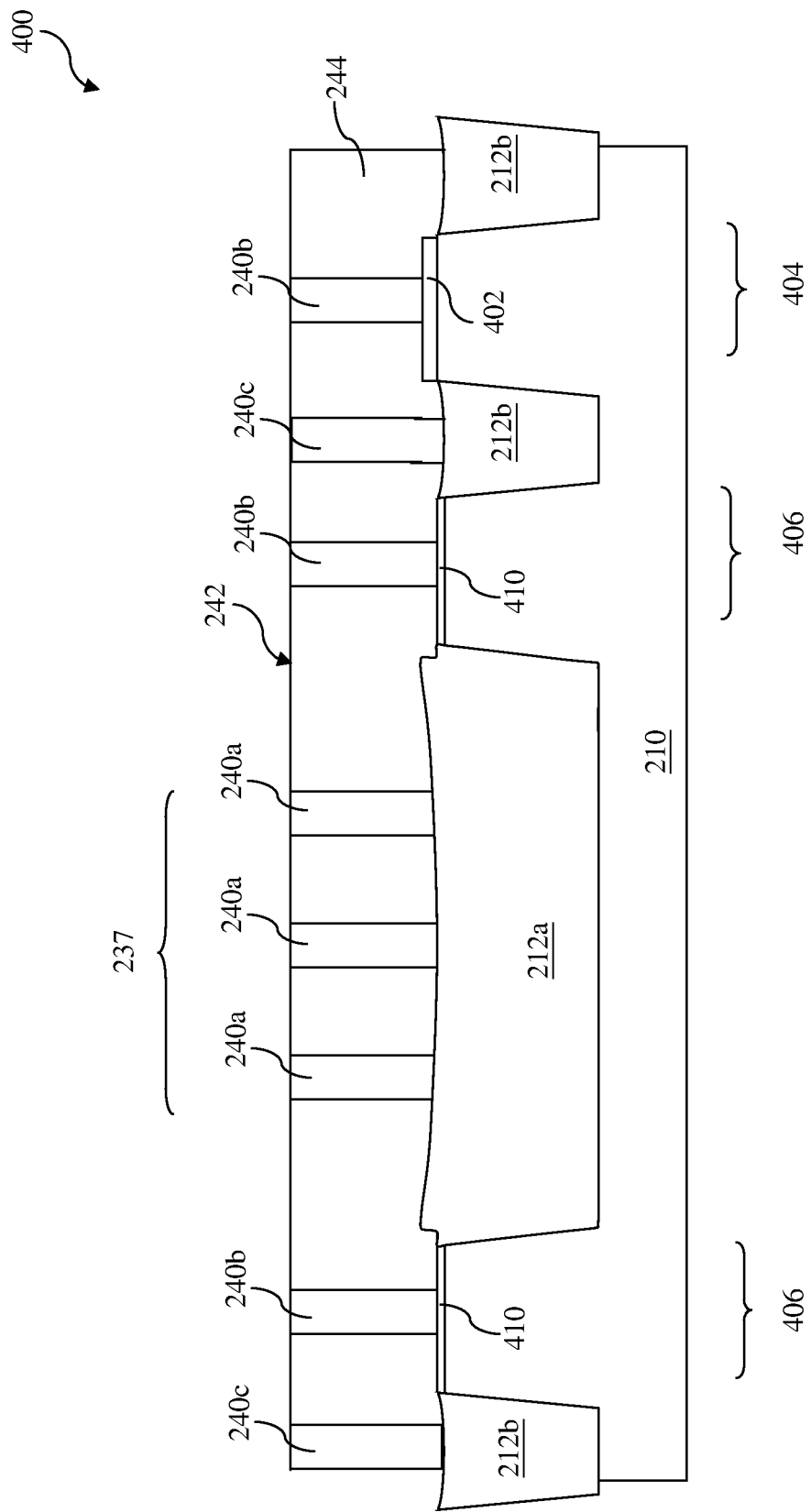

SEMICONDUCTOR STRUCTURE WITH SUPPRESSED STI DISHING EFFECT AT RESISTOR REGION

BACKGROUND

Polysilicon resistors have been incorporated in conventional integrated circuit (IC) design. A high resistance (Hi-R) resistor is located on a shallow trench isolation (STI) structure. The size of the STI structure is defined by the design rule of the active regions. Accordingly, a STI structure, defining the distance between the adjacent active regions, cannot be less than a certain dimension, such as 10×10 $\mu m^2$ in one example. It results in significant STI dishing effect due to large STI dimensions and causes the Hi-R polysilicon resistors on the STI structure lower than the polysilicon structures in other regions. As a consequence, the metal residue on the interlayer dielectric (ILD) and between the Hi-R resistors is difficult to remove during the metal polishing. The metal residue will lead to shorting and the failure of the Hi-R resistors. Therefore, a polysilicon resistor structure and a method making the same are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 9-12 are sectional views of one embodiment of the semiconductor structure of FIG. 8 at various fabrication stages constructed according to various aspects in one or more other embodiments.

DETAILED DESCRIPTION

Figure 1:
FIG. 1 is a flowchart of a method making a semiconductor structure having a resistor constructed according to various aspects in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor structure according to one embodiment. FIGS. 2 through 7 are sectional views of a semiconductor structure 200 having a resistor at various fabrication stages and constructed according to one or more embodiments. The semiconductor structure 200 and the method 100 of making the same are collectively described with reference to FIGS. 1 through 7.

Figure 2:
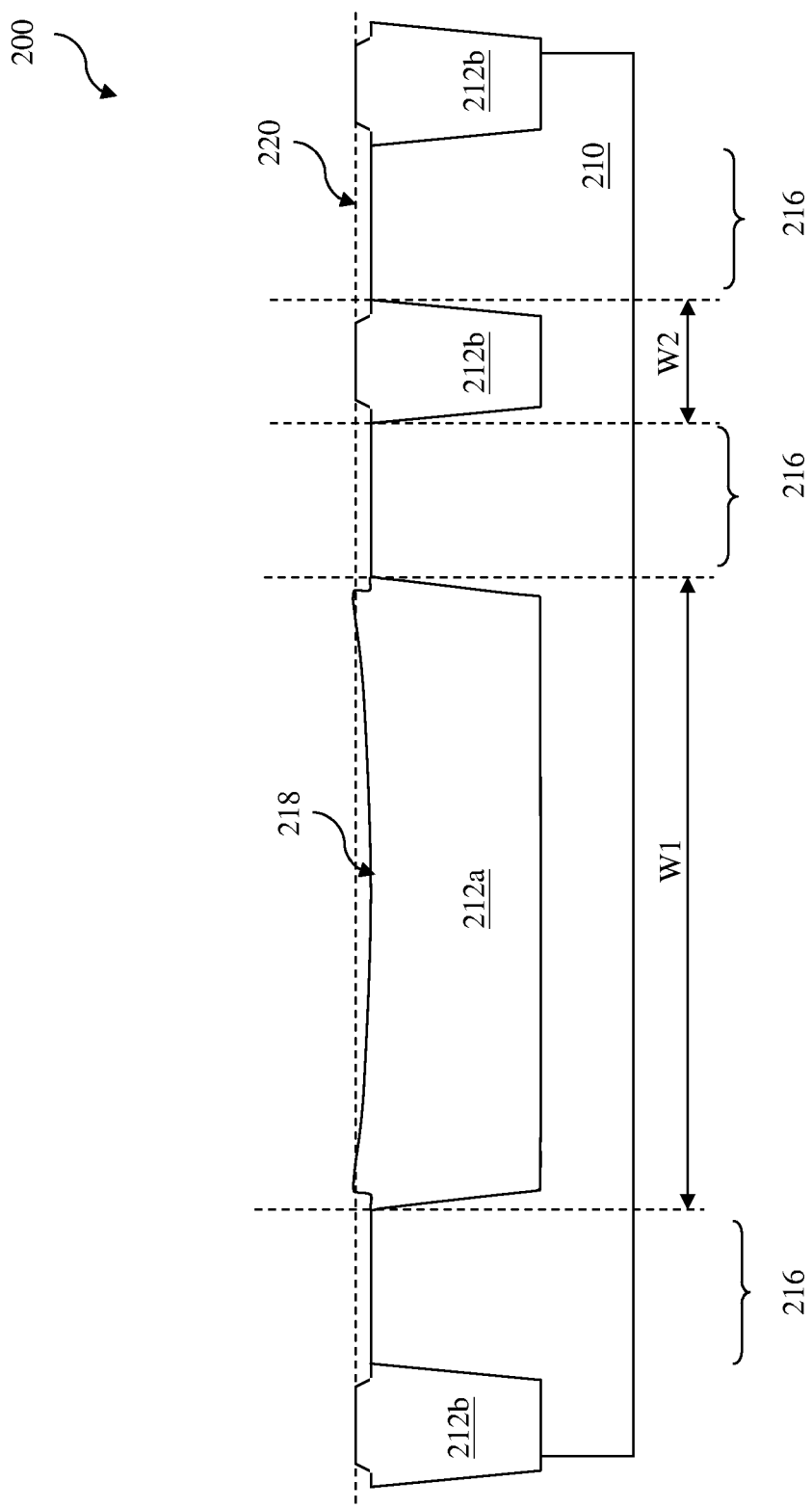
FIGS. 2-7 are sectional views of one embodiment of the semiconductor structure of FIG. 1 at various fabrication stages constructed according to various aspects in one or more embodiments.

Referring to FIGS. 1 and 2, the method 100 begins at step 102 by providing a semiconductor substrate 210. The semiconductor substrate 210 includes silicon. Alternatively, the semiconductor substrate 210 includes germanium, silicon germanium or other proper semiconductor materials.

Still referring to FIGS. 1 and 2, the method 100 proceeds to step 104 by forming various isolation features such as shallow trench isolation (STI) features 212 in the substrate. The STI features 212 includes one or more first STI features 212a of a first width "W1" and one or more second STI features 212b of a second width "W2" substantially less than the first width "W1" as illustrated in FIG. 2. The various STI features (212a and 212b) formed in the semiconductor substrate 210 define various active regions 216 in the semiconductor substrate 210.

The STI features 212 are formed in the substrate 210 by a procedure including etching, deposition and polishing. The formation of the STI features 212 is described below accordingly to one embodiment, which is not intended to limit the scope of the present disclosure. A hard mask layer (not shown) is formed on the semiconductor substrate 210. The hard mask layer includes a silicon oxide layer on the semiconductor substrate 210 and a silicon nitride layer on the silicon oxide layer in one example. In another example, the hard mask layer is formed by growing a pad oxide layer and forming a low pressure chemical vapor deposition (LPCVD) silicon nitride layer.

The hard mask layer is patterned to have various openings to define regions on the semiconductor substrate 210 for the STI features 212. In the present embodiment, the openings include one or more first openings with the first width "W1" and one or more second openings with the second width "W2" in the hard mask layer.

The patterning of the hard mask layer includes forming a patterned photoresist layer on the hard mask layer, etching the hard mask layer using the patterned photoresist layer as an etch mask, and photoresist stripping. The formation of the patterned photoresist layer may further include processing steps of photoresist coating, soft baking, mask aligning, pattern exposing, post-exposure baking, photoresist developing, and hard baking. The photolithography patterning may also be implemented or replaced by other suitable methods such as maskless photolithography, electron-beam writing, ion-beam writing, and molecular imprint.

The semiconductor substrate 210 is then etched through the openings of the hard mask layer to form trenches in the semiconductor substrate 210. In the present embodiment, the trenches include one or more first trenches transferred from the first openings having the first width "W1" and one or more second trenches transferred from the second openings having the second width "W2".

The various trenches in the semiconductor substrate 210 are filled by one or more dielectric materials such as silicon oxide, silicon nitride, silicon oxynitride, low k dielectric material, other suitable dielectric material or combinations thereof. The filled trench may have a multi-layer structure. In one example, the materials filling the trenches include a thermal oxide liner layer and another dielectric material, such as silicon oxide by chemical vapor deposition (CVD).

A chemical mechanical polishing (CMP) process is applied to the semiconductor substrate 210 to remove the excessive filled material(s) and to globally planarize the surface of the semiconductor substrate 210, resulting in the first STI features 212a and the second STI features 212b. The first STI features 212a have the first width "W1" substantially greater than the second width "W2" of the second STI features 212b. As a result, the dishing effect 218 is present to the first STI features 212a, which causes the top surface of the first STI features 212a to be lower than the top surface 220 of the second STI features 212b.

The hard mask layer is then removed by one or more suitable etching steps, such as hot phosphoric acid, hydrofluoric (HF) acid, or both. Alternatively, the pad oxide layer may stay at the present stage and is used as an implant screen layer to avoid a tunneling effect during subsequent implantation steps.

Figure 3:
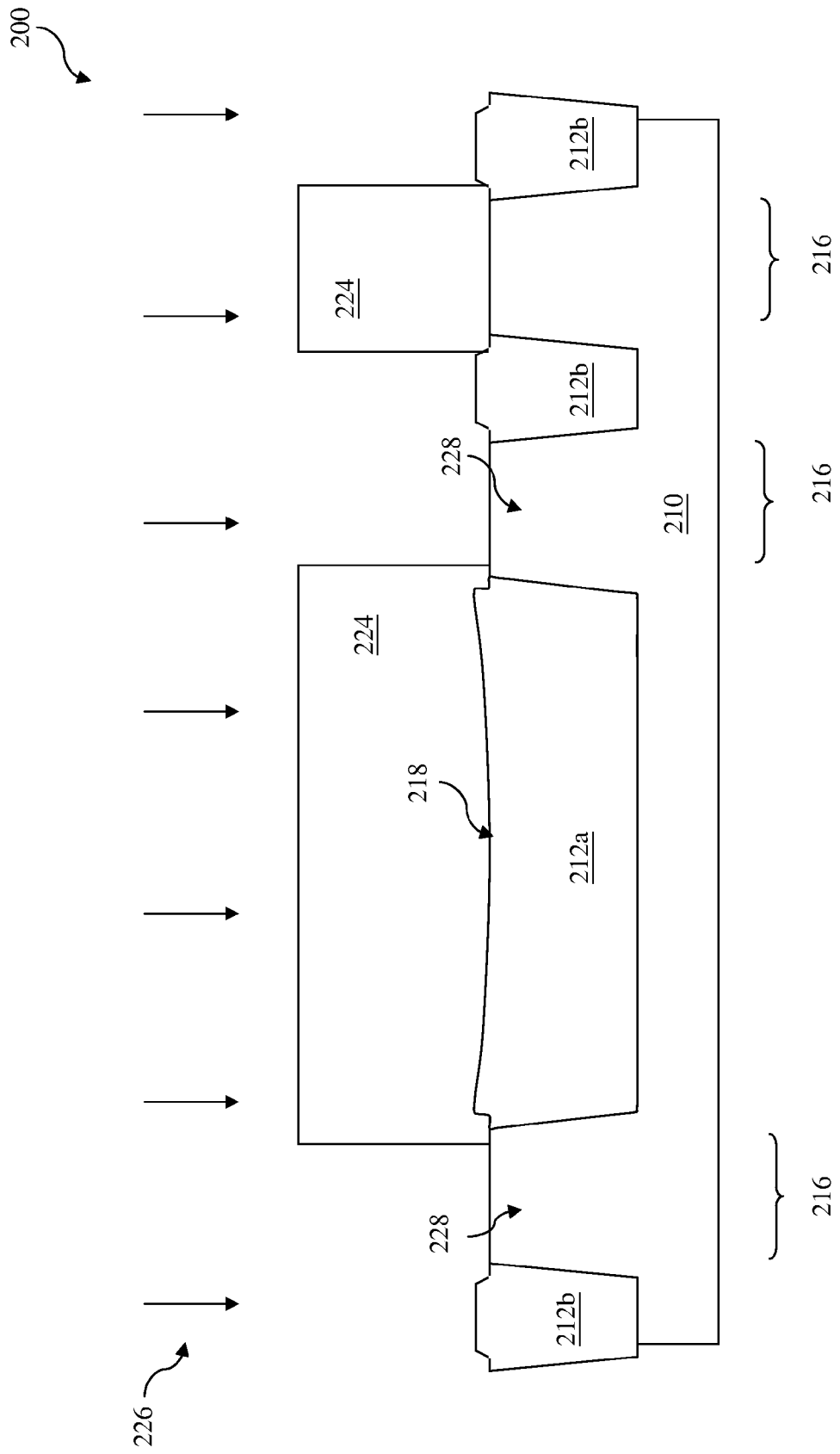

Referring to FIGS. 1 and 3, the method 100 proceeds to step 106 by forming one or more n-wells in a first subset of the active regions 216. A patterned photoresist layer 224 is formed on the semiconductor substrate 210. The patterned photoresist layer 224 covers the first STI features 212a and a second subset of the active regions 216. The patterned photoresist layer 224 includes openings aligned with the first subset of the active regions 216 and the second STI features 212b, exposing those regions and features. The patterned photoresist layer 224 is formed by a process similar to the formation of the patterned photoresist layer for patterning the hard mask layer and defining trench regions for various STI features. For example, the patterned photoresist layer 224 is formed by a procedure including photoresist coating, soft baking, mask aligning, exposing, post-exposure baking, developing, and hard baking.

An n-type ion implantation 226 is applied to the semiconductor substrate 210 using the patterned photoresist layer 224 as an implant mask, introducing an n-type impurity into the first subset of the active regions 216 and forming the n-wells 228 therein. The n-type impurity includes phosphoric (P) or arsenic (As) in one example. The n-type ion implantation 226 introduces the n-type impurity into the second STI features 212b as well, changing the characteristic of the second STI features 212b and making the second STI features 212b more vulnerable and less resistive to the subsequent etching processes relative to the first STI features 212a. The patterned photoresist layer 224 is removed thereafter by plasma ashing or wet stripping.

Figure 4:
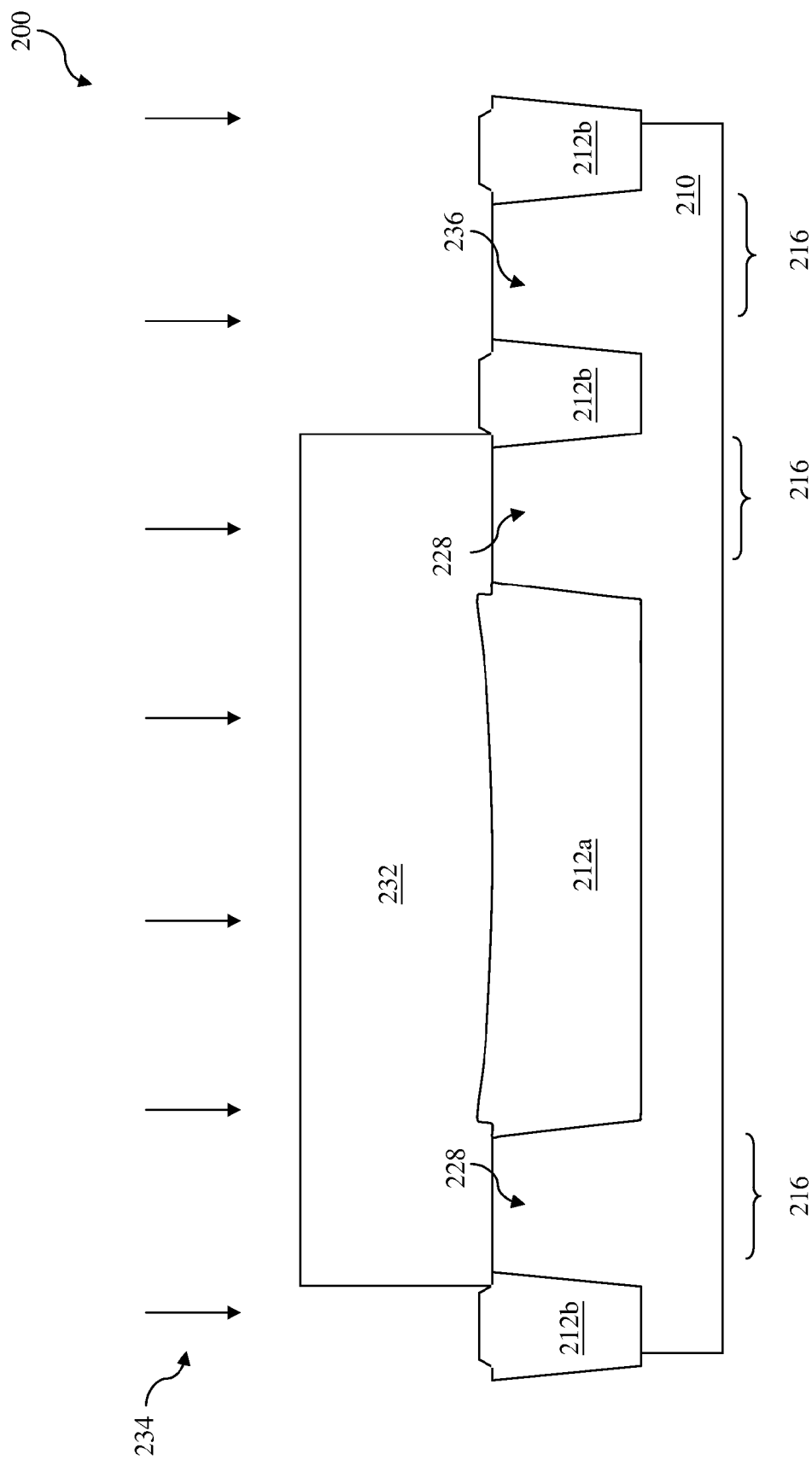

Referring to FIGS. 1 and 4, the method 100 proceeds to step 108 by forming one or more p-wells in the second subset of the active regions 216. A patterned photoresist layer 232 is formed on the semiconductor substrate 210. The patterned photoresist layer 232 covers the first subset of the active regions 216 and the first STI features 212a. The patterned photoresist layer 232 includes openings aligned with the second subset of the active regions 216 and the second STI features 212b, exposing those regions/features. The patterned photoresist layer 232 is formed by a process similar to the process to form the patterned photoresist layer 224.

A p-type ion implantation 234 is applied to the semiconductor substrate 210 using the patterned photoresist layer 232 as an implant mask, introducing a p-type impurity into the second subset of the active regions 216 and forming the p-wells 236 therein. The p-type impurity includes boron (B) or indium (In) in one example. The p-typed ion implantation 234 introduces the p-type impurity into the second STI features 212b as well, changing the characteristic of the second STI features 212b, and making the second STI features 212b more vulnerable and less resistive to the subsequent etching processes relative to the first STI features 212a. The patterned photoresist layer 232 is removed thereafter by plasma ashing or wet stripping.

Figure 5:
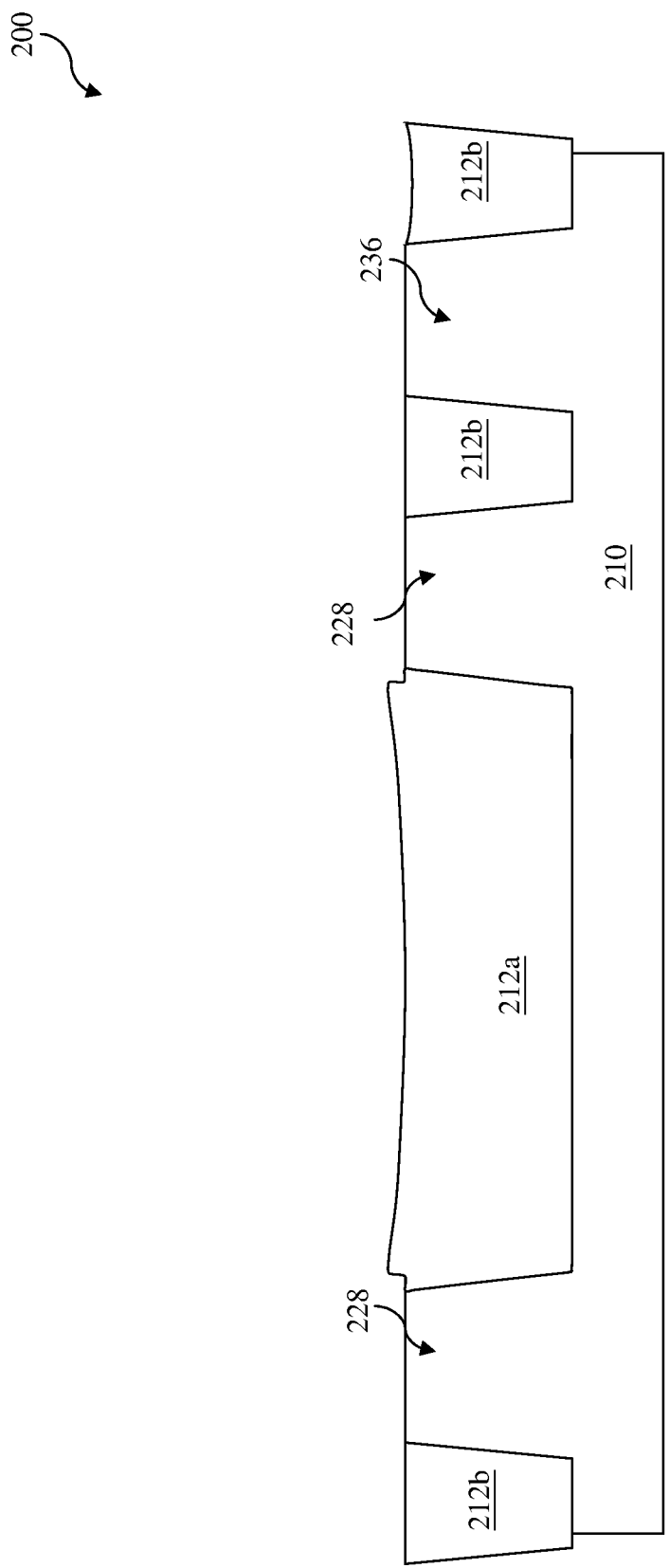

Referring to FIGS. 1 and 5, the method 100 proceeds to step 110 by implementing various etching processes to the semiconductor substrate 210 thereafter. Due to the different characteristics between the first STI features 212a and the second STI features 212b, the second STI features 212b have a higher etch rate than the first STI features 212a. Stated differently, an etching process removes the second STI features 212b at a greater rate than the first STI features 212a. Thus, the thickness difference between the first and second STI features 212a and 212b is reduced. The various etching processes are described below according to one or more embodiments.

In one embodiment, various ion implantation processes are implemented, including ion implantations to tune channel doping profile, such as an ion implantation to tune threshold voltage and/or an ion implantation to reduce the punchthrough effect. Those implantation processes are applied to the n-wells 228 and the p-wells 236, respectively. During those ion implantation processes, an implantation screen layer may be formed on the semiconductor substrate 210 to avoid the implantation tunneling effect. After the completion of one or more implantation processes, the implantation screen layer is removed by an etching process. In the present embodiment, the implantation screen layer includes silicon oxide. The corresponding etching process can reduce the thicknesses of the STI features. Specifically, the corresponding etching process removes more of the second STI features 212b than the first STI features 212a. In one example, the corresponding etching process uses an HF etching solution.

In another embodiment, a chemical cleaning process is applied to semiconductor substrate 210 after one or more ion implantation steps. The chemical cleaning process can also reduce the thicknesses of the STI features 212. Similarly, as the first and second STI features 212a and 212b have different resistance to etching and chemical cleaning due to different characteristics, the chemical cleaning process removes more the second STI features 212b than the first STI features 212a.

In yet another embodiment, a hard mask may be used as an implant mask during one or more implant processes. The hard mask is removed thereafter by an etching process. The first and second STI 212 are exposed for the etching as well. Similarly, since the first and second STI features 212a and 212b have different resistance to etching, the corresponding etching process removes the second STI features 212b more so than the first STI features 212a.

In yet another embodiment, the semiconductor substrate 210 includes field effect transistors (FETs) in a first region for input and output (I/O) circuit and FETs in a second region for core circuit. Since the I/O circuit is designed to have high resistance to electrostatic discharge (ESD) events, different gate dielectric layers are used for the I/O FETs and the core FETs, respectively. Particularly, the I/O FETs include a first gate dielectric layer having a first thickness, and the core FETs include a second gate dielectric layer having a second thickness. The first thickness is substantially greater than the second thickness. In furtherance of the embodiment, the first and second gate dielectric layers are formed separately. In the depicted embodiment, the first gate dielectric layer is formed on the semiconductor substrate 210, and is then patterned to remove a portion in the second region for the core circuit. In one example, the first gate dielectric layer includes silicon oxide. The first gate dielectric layer is selectively removed from the second region by an etching process, such as HF etching. The first and second STI features 212 are exposed to the etching process as well. Similarly, as the first and second STI features 212a and 212b have different resistance to etching due to different characteristics, the etching process removes more of the second STI features 212b than the first STI features 212a.

By implementing one or more etching processes described above in various embodiments, the thicknesses of the first and second STI features 212 are compensated, as illustrated in FIG. 5. The difference between the top surface of the first STI features 212a and the top surface of the second STI features 212b is substantially reduced.

The method 100 compensates the height difference between the first and second STI features 212a and 212b without complicating the manufacturing process. For example, no additional processing step is added to the process flow. Only one or more photomasks are modified with the corresponding design patterns. This can be easily achieved prior to making the photomask. For example, a logic operation is applied to a circuit design pattern to the n-well implant photomask such that the n-well implant photomask defines openings for both the n-well and the second STI features while the p-wells and the first STI features are defined as blackout regions in the photomask. In another example, a logic operation is applied to a circuit design pattern to the p-well implant photomask such that the p-well implant photomask defines openings for both the p-well and the second STI features while the n-wells and the first STI features are defined as blackout regions in the photomask.

Figure 6:
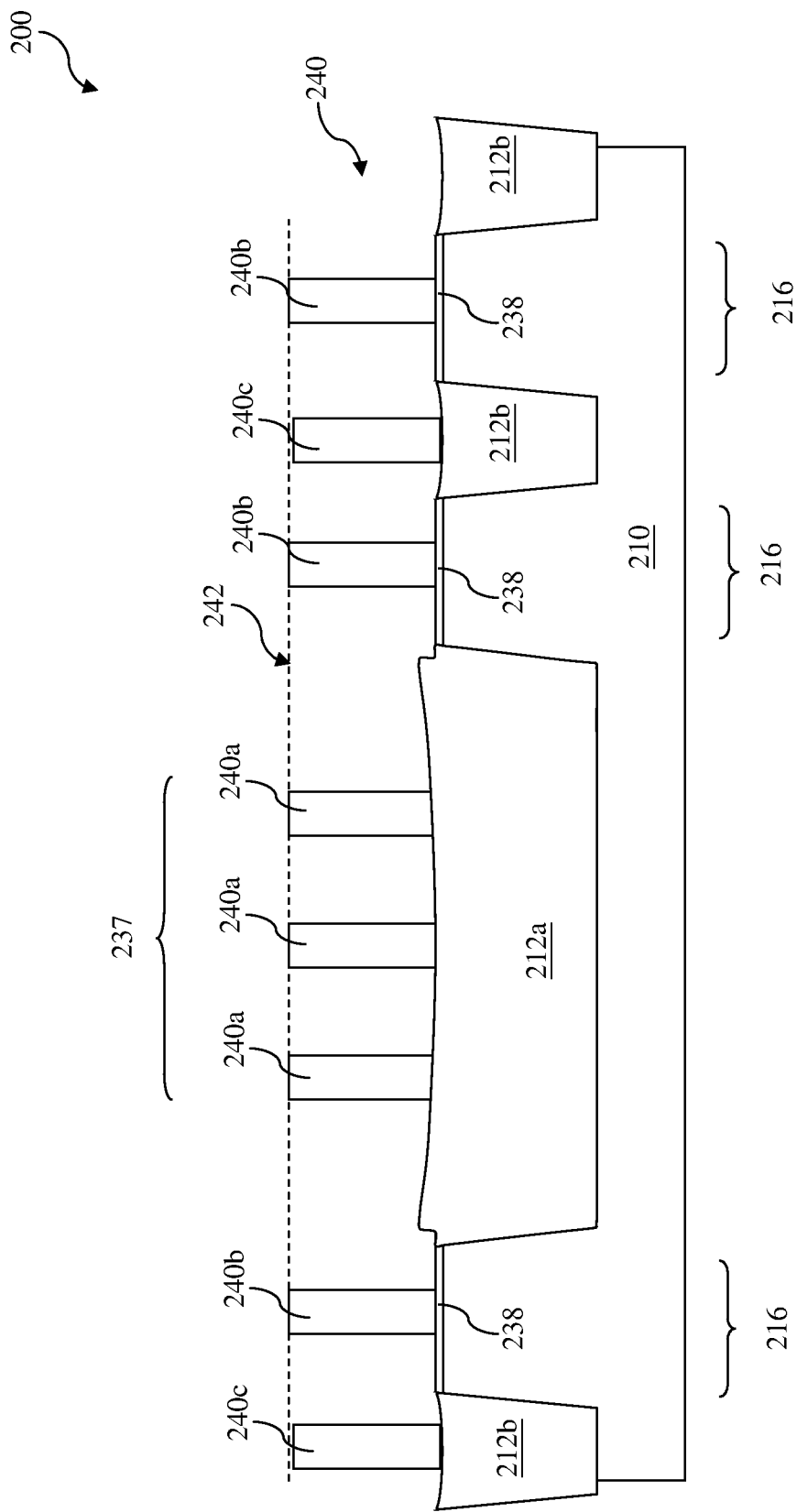

Referring to FIGS. 1 and 6, the method 100 proceeds to step 112 by forming resistors 237 on the first STI features 212a. In one embodiment, the resistors 237 include doped polycrystalline silicon (polysilicon) configured on the first STI features 212a. In another example, the resistors 237 are designed to have high resistances (Hi-R) achieved by the proper dimensions and doping concentration of the resistors 237.

In the present embodiment, the gate stacks for various FETs and the resistors 237 are formed simultaneously in the same procedure. A dielectric layer 238 is formed on the semiconductor substrate 210 by a suitable process, such as thermal oxide or atomic layer deposition (ALD) or CVD. In this example, the STI features 212 and the gate dielectric layer 238 both include silicon oxide. The gate dielectric layer 238 on the STI features 212 is not separately labeled. A polysilicon layer 240 is formed on the gate dielectric layer 238 and is further patterned by lithography and etching to form various polysilicon stacks, such as polysilicon stacks 240a, 240b and 240c. Specifically, the polysilicon stacks include one or more first polysilicon stacks 240a disposed on the first STI features 212a, resulting one or more resistors 237. The polysilicon stacks include one or more second polysilicon stacks 240b disposed on the active regions 216, forming one or more gate electrodes for the FETs. In the depicted embodiment, the polysilicon stacks also include one or more third polysilicon stacks 240c disposed on the second STI features 212b, forming one or more dummy gate electrodes for improving pattern density or for other process integration consideration.

By implementing one or more above described etching processes to the semiconductor structure 200 according to various embodiments, the height difference between the first and second STI features 212a and 212b is substantially reduced. Accordingly, the gate stacks 240b (and the dummy gate stacks 240c as well) and the resistors 240a have a substantially planarized and flush top surface 242 as illustrated in FIG. 6.

Figure 7:
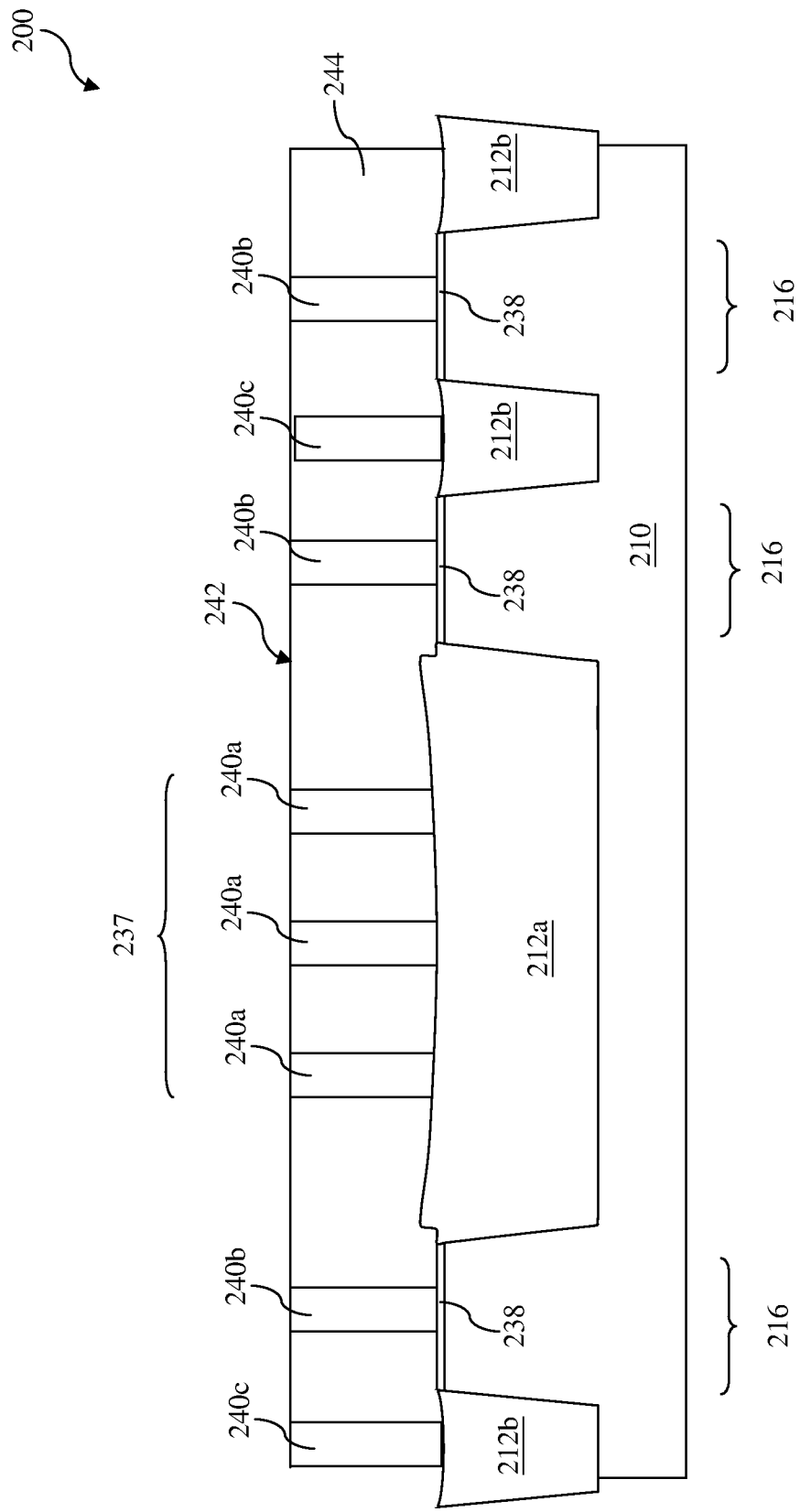

Referring to FIGS. 1 and 7, the method 100 may proceed to step 114 by forming other circuit features such as source and drain features in the active regions of the semiconductor substrate, and/or multilayer interconnection (MLI) on the semiconductor substrate 210.

In one embodiment, the source and drain regions (not shown) include light doped drain (LDD) regions and heavily doped source and drain (S/D) features, collectively referred to as source and drain, formed by one or more implantation processes. For example, n-type FETs (nFETs) are formed on the p-wells 236, and p-type FETs (pFETs) are formed on the n-wells 228. The source and drain are formed, respectively, for the n-type FETs and the p-type FETs, using proper doping species. In one embodiment, taking n-type FETs as an example, the LDD features are formed by an ion implantation with a light doping dose. Thereafter, spacers are formed by dielectric deposition and anisotropic etch, such as plasma etch. Then the heavily doped S/D features are formed by an ion implantation with a heavy doping dose. The various source and drain features of the p-type FETs can be formed in a similar procedure but with opposite doping type. The sidewall spacer can be formed to the resistors in the process to form the spacers of nFETs and the pFETs. In one embodiment, a high temperature annealing process is subsequently performed to activate the various doping species in the source and drain regions.

In another embodiment, the resistors 237 are doped by one or more implantation steps to tune or increase the resistivity thereof. In one example, the resistors 237 are doped by one or more separate implantation steps for independently tuning the resistivity thereof. In another example, a subset of the implantation steps to form n-type S/D or p-type S/D are applied to the resistors 237 as well.

In another embodiment, an inter-level dielectric (ILD) layer 244 (also referred to as ILD0) is formed on the semiconductor substrate 210. Particularly, the ILD layer 244 substantially fills the gaps between the polysilicon stacks 240. The ILD layer 244 includes silicon oxide, low k dielectric material, other suitable dielectric materials, or combinations thereof. The ILD layer 244 is formed by a suitable technique, such as CVD. For example, a high density plasma CVD can be executed to form the ILD layer 244. In furtherance of the embodiment, the ILD layer 244 is formed on the semiconductor substrate 210 to a level above the top surface of the resistors and the gate stacks.

A CMP process is applied to the ILD layer 244 to reduce the thickness of the ILD layer 244 such that the resistors 237 and the gate stacks are exposed from the top side. The processing conditions and parameters of the CMP process, including slurry chemical and polishing pressure, can be tuned to partially remove and planarize the ILD layer 244.

In the present embodiment, the resistors 237 have high resistance (referred to as high resistance or Hi-R resistor). In furtherance of the present embodiment, the Hi-R resistors 237 are formed on a STI feature with large dimensions, for example, dimensions greater than 10 micron×10 micron. The first STI features 212a with the first width "W1" is incorporated in the semiconductor structure 200. As mentioned above, the first STI features 212a have a significant dishing effect than the second STI features 212b, resulting in the height difference therebetween. Again, since the height difference between the first and second STI features 212a and 212b is substantially reduced by the above described steps, the gate stacks 240b (as well as the dummy gate stacks 240c), the resistors 240a and the ILD layer 244 have a substantially planarized top surface as illustrated in FIG. 7. When contacts are formed in the ILD layer 244, or when metal gates are formed to replace the polysilicon gate electrodes, undesired metal residue on the ILD layer 244 between the resistors 237 on the first STI features 212 are eliminated, and the corresponding short issue is eliminated as well.

Figure 8:
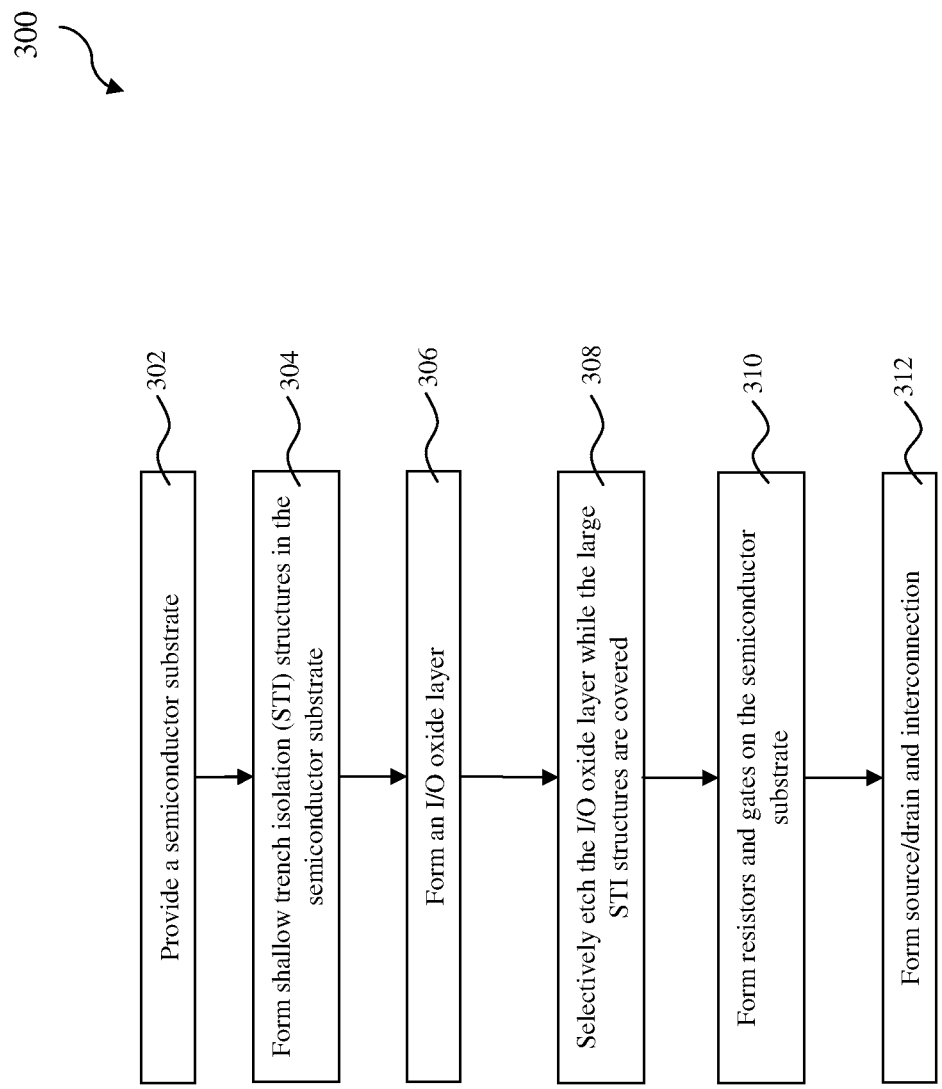
FIG. 8 is a flowchart of a method making a semiconductor structure having a resistor constructed according to various aspects in another embodiment.

FIG. 8 is a flowchart of a method 300 for making a semiconductor structure according to another embodiment. FIGS. 9 through 12 are sectional views of a semiconductor structure 400 having one resistor at various fabrication stages and constructed according to one or more other embodiments. The semiconductor structure 400 and the method 300 of making the same are collectively described with reference to FIGS. 8 through 12.

Figure 9:
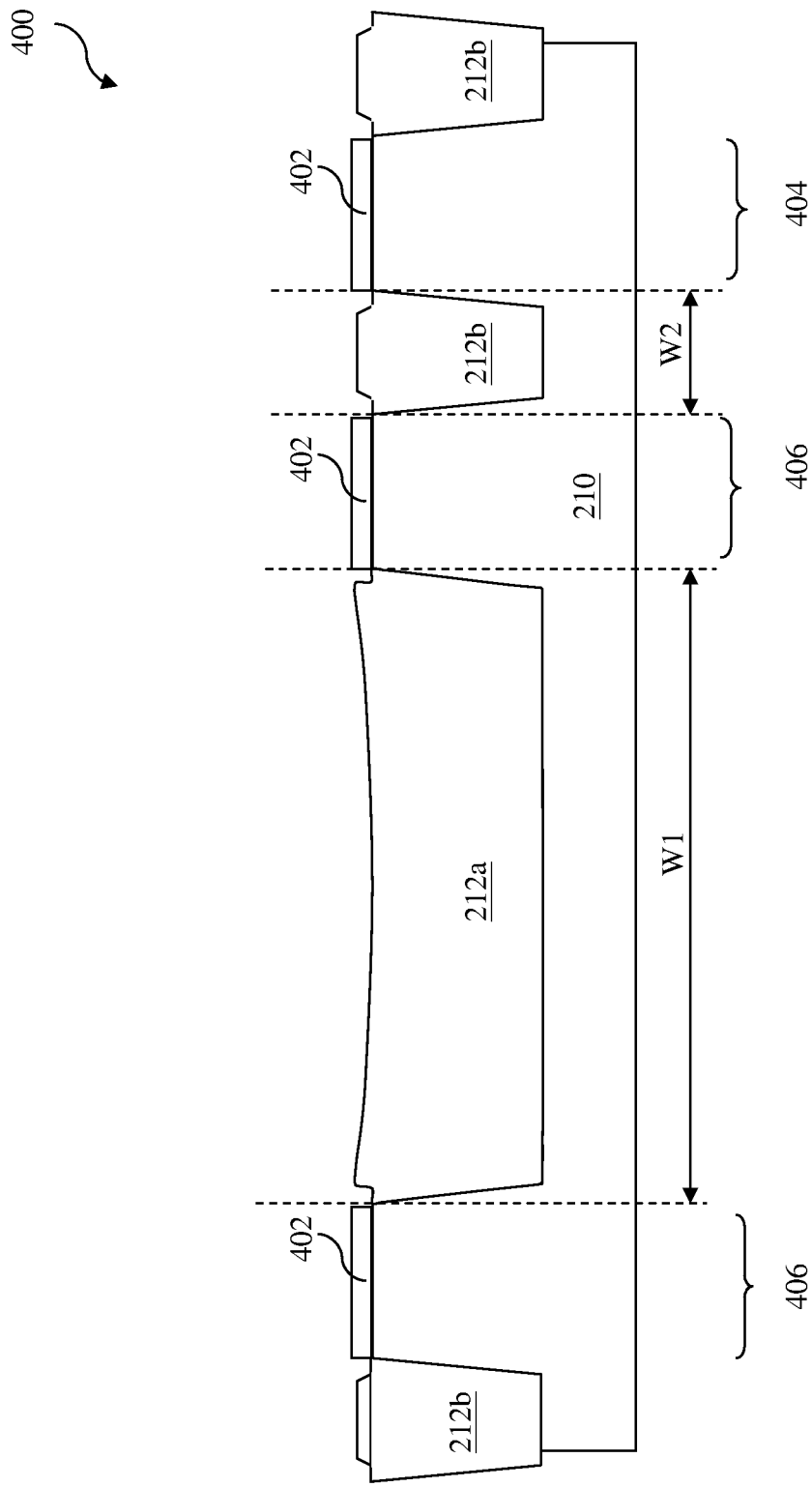

Referring to FIGS. 8 and 9, the method 300 begins at step 302 by providing a semiconductor substrate 210. The semiconductor substrate 210 includes silicon. Alternatively, the substrate includes germanium, silicon germanium or other proper semiconductor materials.

Still referring to FIGS. 8 and 9, the method 300 proceeds to step 304 by forming various isolation features such as shallow trench isolation (STI) features 212 in the substrate. The STI features 212 include one or more first STI features 212a of a first width "W1" and one or more second STI feature 212b of a second width "W2" substantially less than the first width "W1" as illustrated in FIG. 9. The various STI features (212a and 212b) formed in the semiconductor substrate 210 define various active regions 404 and 406 in the semiconductor substrate 210. In the depicted embodiment, the semiconductor substrate 210 includes first active regions 404 for the I/O circuit and second active regions 406 for the core circuit.

The formation of the STI features 212 is similar to the formation of the STI features 212 in FIG. 2. For example, the STI features 212 are formed by a procedure including, forming a patterned hard mask, etching the semiconductor substrate 210 to form trenches, filling the trenches with one or more dielectric materials, and applying a CMP process to remove the excessive dielectric materials and to planarize the surface of the semiconductor substrate.

The method 300 may also include other processing steps, such as various ion implantation steps. In one embodiment, the other processing steps include ion implantations to form respective n-wells and p-wells. In one example, the implantation processes to form the n-wells and the p-wells are similar to the steps 106 and 108 of FIG. 1. In a particular example, the ion implantation to form the n-wells are applied to the semiconductor substrate 210 through an implantation mask with openings aligned with the active regions for the n-wells and the second STI features 212b while the active regions for the p-wells and the first STI features 212a are covered from the corresponding ion implantation. Similarly, the ion implantation to form the p-wells are applied to the semiconductor substrate 210 through another implantation mask with openings aligned with the active regions for the p-wells and the second STI features 212b while the active regions for the n-wells and the first STI features 212a are covered from the corresponding ion implantation according to another example.

In another embodiment, the other processing steps include various ion implantation processes to tune the channel doping profiles for p-type FETs and n-type FETs, such as an ion implantation to tune threshold voltage and/or an ion implantation to reduce the punch-through effect. Those implantation processes are applied to the n-wells and the p-wells, respectively. In yet another embodiment, during those ion implantation processes, an implantation screen layer may be formed on the semiconductor substrate 210 to avoid the implantation tunneling effect. After the completion of one or more implantation processes, the implantation screen layer is removed by an etching process.

Still referring to FIGS. 8 and 9, the method 300 proceeds to step 306 by forming an I/O gate oxide layer 402 on the semiconductor substrate 210. The semiconductor substrate 210 includes the first active region 404 for I/O circuit and the second active region 406 for core circuit. Since the I/O circuit is designed to have high resistance to electrostatic discharge (ESD) events, the corresponding gate dielectric layer 402 for the I/O FETs has a thickness greater than that of the core FETs. The I/O and core gate dielectric layers are formed separately. In the depicted embodiment, the I/O gate dielectric layer 402 is formed on the semiconductor substrate 210. In one example, the I/O gate dielectric layer 402 includes silicon oxide, and the STI features 212 include silicon oxide. The I/O gate dielectric layer 402 of silicon oxide may have a thickness ranging between about 30 and about 60 angstrom. The I/O gate dielectric layer 402 may be formed by thermal oxide, atomic layer deposition (ALD) or other suitable technique. A portion of the I/O gate dielectric layer 402 on the STI features 212 is not separately labeled in FIG. 8 and is collectively labeled as the STI features 212a or 212b. This illustration is only for simplicity and is not intended to limit the scope of the present disclosure. The I/O gate dielectric layer 402 may additionally or alternatively include other suitable dielectric material, such as high k dielectric material formed by a suitable technique.

Figure 10:
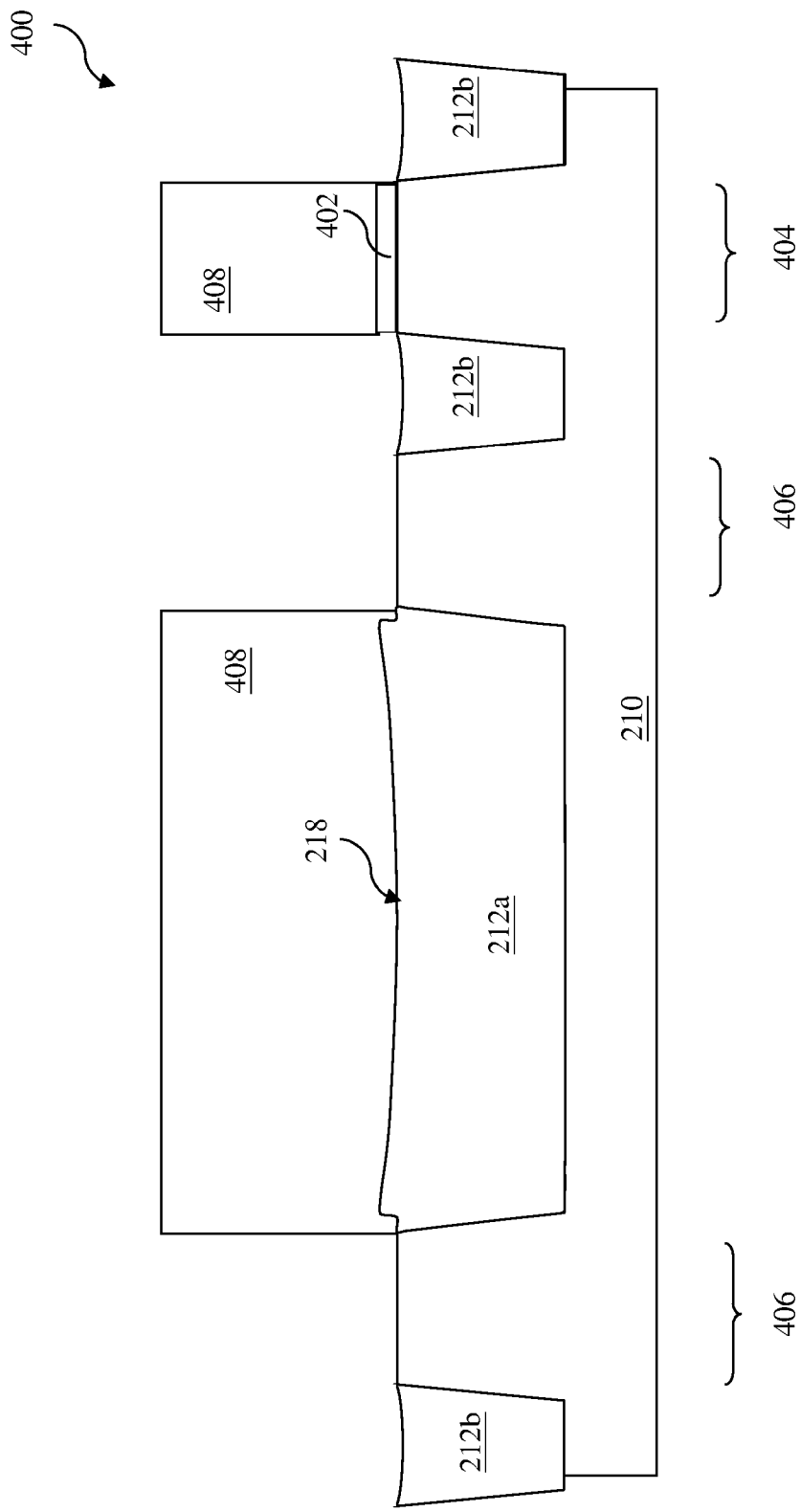

Referring to FIGS. 8 and 10, the method 300 proceeds to step 308 by selectively removing the I/O gate dielectric layer 402 from the second active region 406 of the semiconductor substrate 210. In the present embodiment, the selective removal of the I/O gate dielectric layer 402 includes a lithography process and an etching process.

A patterned photoresist layer 408 is formed on the I/O gate dielectric layer 402. The patterned photoresist layer 402 includes various openings that expose the second active region 406 and the second STI features 212b while the first active region 404 and the first STI features 212a are covered by the patterned photoresist layer 408. The patterned photoresist layer 408 is formed by a process similar to the process of forming the patterned photoresist layer 232 in FIG. 4.

An etching process is applied to the I/O gate dielectric layer 402 through the openings of the patterned photoresist layer 408. The etching process employs a suitable etching technique with proper etchant. In the present embodiment, the I/O gate dielectric layer 402 includes silicon oxide, and the etching process includes a wet etching process using a HF etchant.

During the etching process applied to the I/O gate dielectric layer 402, the second STI features 212b are exposed to the etching process as well, and the thickness of the second STI features 212b is reduced thereby, while the first STI features 212a are covered from the etching process. The height difference between the first STI features 212a and the second STI features 212b is substantially reduced.

Figure 11:
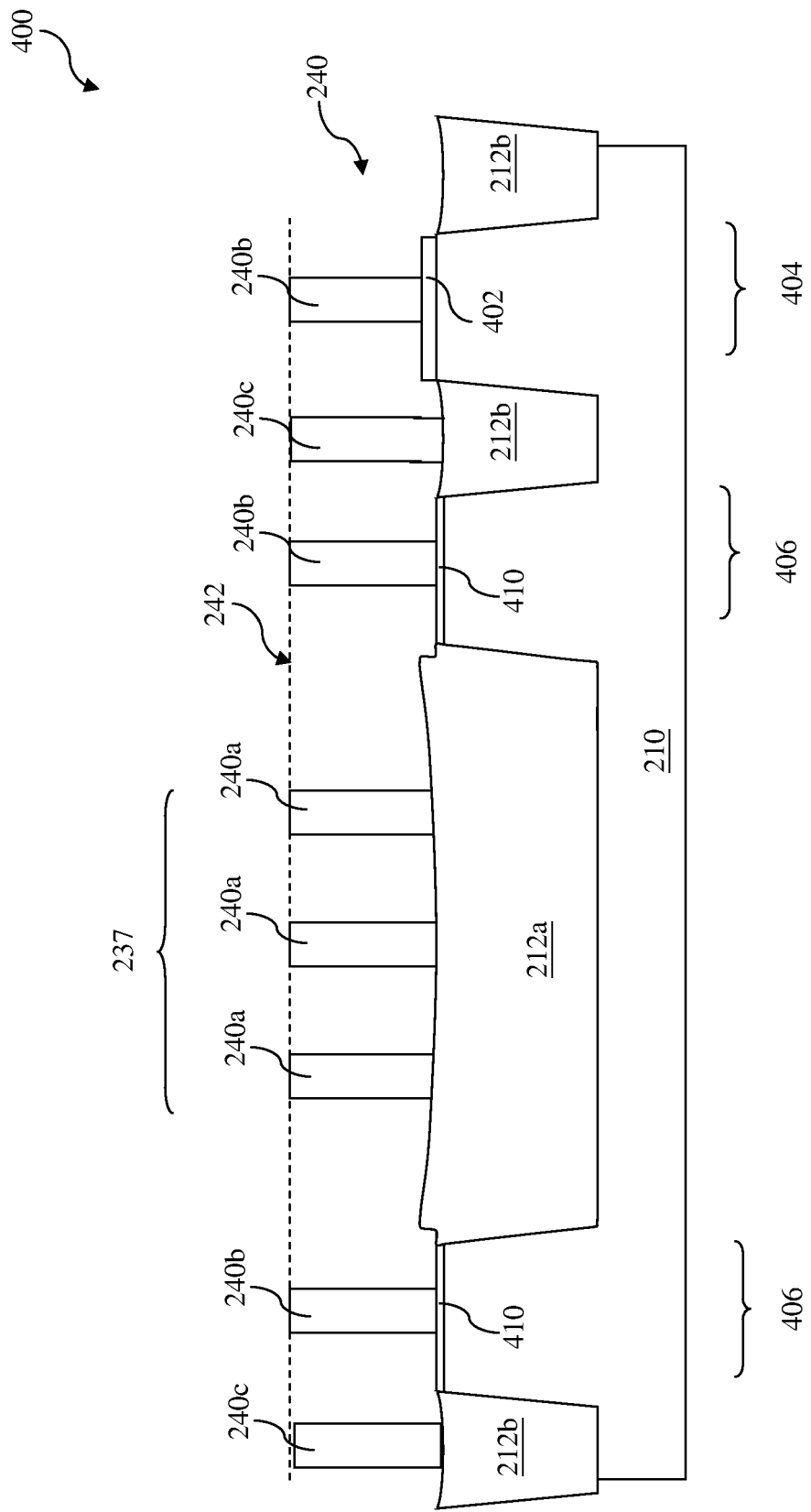

Referring to FIG. 11, a core gate dielectric layer 410 for the core FETs is further formed on the semiconductor substrate 210. In one embodiment, the core gate dielectric layer 410 is patterned such that it is selectively removed from the active regions 404. In furtherance of the embodiment, another etching process is applied to the core gate dielectric layer to selectively remove the core gate dielectric layer from the active regions 404 and the second STI features 212b while the active regions 406 and the first STI features 212a are covered by an etch mask (such as another patterned photoresist layer) from the etching process. The height difference between the first STI features 212a and the second STI features 212b is further reduced or eliminated.

In another embodiment, the core gate dielectric layer is formed on the second active regions 406 for the core circuit and the first active regions 404 for the I/O circuit. Thus the collective thickness of the gate dielectric layer for the FETs in the first active regions 404 for the I/O circuit is the total of the I/O and core gate dielectric layers.

Still referring to FIGS. 8 and 11, the method 300 proceeds to step 310 by forming one or more resistors 237 on the first STI features 212a. In one embodiment, the resistors 237 include doped polycrystalline silicon (polysilicon). In another example, the resistors 237 are designed to have high resistances achieved by the proper dimensions and doping concentration.

In the present embodiment, the resistors 237 and various gate stacks are formed simultaneously in a same procedure. A polysilicon layer 240 is formed on the semiconductor substrate 210 and is further patterned by lithography and etching to form various polysilicon stacks, such as polysilicon stacks 240a, 240b and 240c. Specifically, the polysilicon stacks include one or more first polysilicon stacks 240a disposed on the first STI features 212a, resulting in one or more resistors 237. The polysilicon stacks include one or more second polysilicon stacks 240b disposed on the gate dielectric layer 402 on the first active regions 404, forming one or more gate electrodes for the I/O FETs. The polysilicon stacks further include one or more second polysilicon stacks 240b disposed on the gate dielectric layer 410 on the second active regions 406, forming one or more gate electrodes for the core FETs. In the depicted embodiment, the polysilicon stacks also include one or more third polysilicon stacks 240c disposed on the second STI features 212b, forming dummy gate electrodes for improving pattern density or other process integration consideration.

By implementing steps 306 and 308 of the method 300 according to various embodiments, the height difference between the first and second STI features 212a and 212b is substantially reduced. Accordingly, the gate stacks 240b (the dummy gate stacks 240c as well) and the resistors 240a have a substantially planarized top surface 242 as illustrated in FIG. 11.

Referring to FIGS. 8 and 12, the method 300 may proceed to the step 312 by forming other features such as source and drain features in the active regions, and/or multilayer interconnection (MLI) on the semiconductor substrate 210. The step 312 is similar to the step 114 of the method 100.

In one embodiment, the source and drain regions (not shown), including LDD regions and heavily doped source and drain (S/D) features (collectively referred to as source and drain), are formed by one or more implantation processes. The source and drain are formed, respectively, for the n-type FETs and the p-type FETs, using proper doping species.

In another embodiment, the resistors 237 are doped by one or more implantation steps to tune or increase the resistivity thereof. In one example, the resistors 237 are doped by one or more separate implantation steps for independently tuning the resistivity thereof. In another example, a subset of the implantation steps to form n-type S/D or p-type S/D are applied to the resistors 237 as well.

In yet another embodiment, an ILD layer 244 is formed on the semiconductor substrate 210. Particularly, the ILD layer 244 substantially fills the gaps between the polysilicon stacks 240. The ILD layer 244 includes silicon oxide, low k dielectric material, other suitable dielectric materials, or combinations thereof. The ILD layer 244 is formed by a suitable technique, such as CVD. For example, a high density plasma CVD can be executed to form the ILD layer 244. In furtherance of the embodiment, the ILD layer 244 is formed on the semiconductor substrate 210 to a level above the top surface of the resistors and the gate stacks.

A CMP process is applied to the ILD layer 244 to reduce the thickness of the ILD layer 244 such that the resistors 237 and the gate stacks are exposed from the top side. The processing conditions and parameters of the CMP process, including slurry chemical and polishing pressure, can be tuned to partially remove and planarize the ILD layer 244.

The MLI is formed on the semiconductor substrate 210, which includes vertical interconnects, such as conventional vias or contacts, and horizontal interconnects, such as metal lines. The various interconnection features may use various conductive materials including copper, tungsten and silicide. In one example, a damascene process is used to form copper related multilayer interconnection structure. In another embodiment, tungsten is used to form tungsten plug in the contact holes.

Since the height difference between the first and second STI features 212a and 212b is substantially reduced by the above described steps, the gate stacks 240b (the dummy gate stacks 240c as well), the resistors 240a and the ILD layer 244 have a substantially planarized top surface 242 as illustrated in FIG. 12. When contacts are formed in the ILD layer 244, or metal gates are formed to replace the polysilicon gate electrodes, undesired metal residue on the ILD layer 244 between the resistors 237 are eliminated and the corresponding short issue is avoided.

Although not shown, alternatives materials and processing steps may be used to form various features. In one embodiment, the method 100 and the method 300 may be combined by taking the advantages of STI height difference reduction from both methods. For example, the method may include a selective etching process (step 308 in the method 300) and a procedure of differentiating the STI etching resistance and performing an etching process thereafter (steps 106/108 and 110 in the method 100) to reduce the STI height difference. In another embodiment, one or more resistors 237 formed on the first STI features 212a can be properly configured and alternatively used as a polysilicon fuse (or amorphous silicon fuse) for other applications. In another embodiment, the resistors are configured as an array, each being disposed on the first STI features 212 and adjacent passive devices being separated by active regions. The semiconductor structure 200/400 is a portion of an integrated circuit having both plurality of resistors and various field effect transistors each with a gate stack of high k dielectric and metal electrode. In this case, the polysilicon gate stacks 240b are replaced by gate stacks of high k dielectric and metal electrode. In another embodiment, the polysilicon layer 240 can be in-situ doped (such as boron doped).

In another embodiment, during each ion implantation, a hard mask may be used as an implantation mask. In a detailed description of the embodiment, a hard mask layer is deposited on the semiconductor substrate 210. The hard mask layer includes a dielectric material, such as silicon oxide, silicon nitride, silicon oxynitride or combinations thereof. The hard mask layer is formed CVD or other suitable technique. A patterned photoresist layer is formed on the hard mask layer and is used to pattern the hard mask layer using an etching process such that the openings of the patterned photoresist layer are transferred to the hard mask layer. The patterned photoresist layer is removed by wet stripping or plasma ashing. The respective ion implantation is applied to the semiconductor substrate 210 through the openings of the hard mask layer. The hard mask layer is removed thereafter.

In another embodiment, a p-type FET (pFET) has a strained structure for enhanced carrier mobility and improved device performance. In furtherance of the embodiment, silicon germanium (SiGe) is formed in the source and drain regions of the pFET to achieve a proper stress effect. In one example of forming such a strained pFET, the silicon substrate within the source and drain regions of the pFET are recessed by one or more etching step. Then SiGe is epi grown in the recessed regions and heavy doped source and drain are formed in the epi grown SiGe features. In another example, a dummy spacer is formed after the formation of the LDD features. The dummy spacer is removed after the formation of the SiGe features. Then a main spacer is formed on the sidewalls of the associated gate stack, with a different thickness such that the heavy doped source and drain have an offset from the SiGe features. For instance, the main spacer is thicker than the dummy spacer such that the heavy doped source and drain are formed in the SiGe features.

In another embodiment, an n-type FET (nFET) has a strained structure for enhanced carrier mobility and improved device performance. In furtherance of the embodiment, silicon carbide (SiC) is formed in the source and drain regions of the nFET to achieve a proper stress effect at step 104. The strained nFET can be formed similarly the strained pFET. In another embodiment, the n-metal and p-metal layers each may include other proper metal or metal alloy. In another embodiment, the n-metal and p-metal layers each have a multi-layer structure to have an optimized work function and reduced threshold voltage. Other processing steps may be implemented before, during and/or after the formation of the resistors.

In another embodiment, the method 100 or 300 may be executed in a different sequence. For example, the step 106 for n-well implantation and the step 108 for p-well implantation are implemented in a different order such that the step 108 for p-well implantation is implemented first and the step 106 for n-well implantation is implemented thereafter.

The present disclosure is not limited to applications in which the semiconductor structure includes a FET (e.g. MOS transistor) and a polysilicon resistor (or polysilicon fuse), and may be extended to other integrated circuit having a metal gate stack. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other types of transistors, including single-gate transistors, double-gate transistors and other multiple-gate transistors, and may be employed in many different applications, including sensor cells, memory cells, logic cells, and others.

Thus, the present disclosure provides one embodiment of a method making an integrated circuit. The method includes forming a first isolation feature of a first width and a second isolation feature of a second width in a substrate, the first width being substantially greater than the second width; forming an implantation mask on the substrate, wherein the implantation mask covers the first isolation feature and uncovers the second isolation feature; performing an ion implantation process to the substrate using the implantation mask; and thereafter performing an etching process to the substrate.

In one embodiment of the disclosed method, the forming of the first and second isolation features includes etching the substrate to form a first trench and a second trench in the substrate; filling a dielectric material in the first and second trench; and thereafter applying a polishing process to the substrate, resulting in the first and second isolation features. The forming the implantation mask on the substrate may include forming a photoresist layer on the substrate. In one embodiment, the implantation mask includes a first opening to expose the second isolation feature and an N-well active region in the substrate; and the ion implantation process uses a p-type dopant. In another embodiment, the implantation mask includes a first opening to expose the second isolation feature and a P-well active region in the substrate; and the ion implantation process uses an n-type dopant. In various embodiments, the performing the etching process includes one selected from the group consisting of etching to pattern a second gate dielectric material layer for I/O circuit; etching to remove an implantation screen layer; implantation cleaning; and combinations thereof. The performing the etching process includes performing the etching process using an etch mask covering the second isolation feature and uncovering the first isolation feature. In another embodiment, the method further includes forming a dielectric material layer on the substrate; forming an etch mask on the dielectric material layer, wherein the etch mask covers the first isolation feature and an active region for I/O circuit; and uncovers the second isolation feature and an active region for core circuit; and performing an etching process to the dielectric material layer through the etch mask. In other embodiments, the dielectric material layer includes silicon oxide; and the etch mask includes a photoresist layer. The method may further include forming a resistance resistor on the first isolation feature after the performing the etching process to substrate. The forming the resistance resistor on the first isolation feature may include forming a doped polysilicon resistor with high resistance. In another embodiment, the forming the resistor includes forming a polysilicon layer on the substrate; and patterning the polysilicon layer to form a polysilicon resistor on the first isolation feature and a polysilicon gate on an active region. In yet another embodiment, the performing the ion implantation process to the substrate includes introducing a dopant to the second isolation feature, reducing a resistance of the second isolation feature to the etching process; and the performing the etching process includes etching the first isolation feature with a first etch rate and etching the second isolation feature with a second etch rate greater than the first etch rate.

The present disclosure also provides another embodiment of a method making an integrated circuit. The method includes forming a first isolation feature of a first width and a second isolation feature of a second width in a semiconductor substrate, the first width being substantially greater than the second width; forming a dielectric material layer on the semiconductor substrate; forming an etch mask on the dielectric material layer. The etch mask is patterned to cover the first isolation feature and a first active region, and to uncover the second isolation feature and a second active region; and performing an etching process to the dielectric material layer through the etch mask, reducing a thickness of the second isolation feature. In another embodiment, the first active region is configured for an input/output (I/O) device; and the second active region is configured for a core device. In yet another embodiment, the first and second isolation features include silicon oxide; and the dielectric material layer includes silicon oxide. In yet another embodiment, the method further includes forming an implantation mask on the substrate, wherein the implantation mask covers the first isolation feature and uncovers the second isolation feature; and performing an ion implantation process to the substrate using the implantation mask. In yet another embodiment, the method further includes forming a polysilicon layer on the substrate; and patterning the polysilicon layer to form a polysilicon resistor on the first isolation feature and a polysilicon gate on an active region.

The present disclosure also provides an embodiment of an integrated circuit. The integrated circuit includes a semiconductor substrate; a first shallow trench (STI) isolation feature of a first width and a second STI feature of a second width in a semiconductor substrate, the first width being substantially less than the second width; a field-effect transistor (FET) disposed in an active region of the semiconductor substrate; and a resistor disposed on the second STI feature, wherein the first STI includes an impurity of a first doping concentration substantially higher than a second doping concentration of the impurity in the second STI feature. In one example, the integrated circuit further includes a gate stack disposed on an active region, wherein the gate stack and the resistor include polysilicon. In another example, the integrated circuit further includes a first field effect transistor (FET) for an input/output (I/O) circuit, the first FET includes a first gate oxide layer of a first thickness; a second FET for a core circuit, the second FET includes a second gate oxide layer of a second thickness substantially less than the first thickness, wherein the first and second STI features include silicon oxide.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making an integrated circuit, the method comprising:
   forming a first isolation feature of a first width and a second isolation feature of a second width in a substrate, the first width being substantially greater than the second width;
   forming an implantation mask on the substrate, wherein the implantation mask covers the first isolation feature and exposes the second isolation feature;
   performing an ion implantation process to the substrate using the implantation mask thereby introducing a dopant to the second isolation feature such that a resistance of the second isolation feature to an etching process is reduced; and
   thereafter performing the etching process to the substrate.

2. The method of claim 1, wherein the forming of the first and second isolation features includes:
   etching the substrate to form a first trench and a second trench in the substrate;
   filling the first and second trenches with a dielectric material; and
   thereafter applying a polishing process to the substrate, thereby forming the first and second isolation features.

3. The method of claim 1, wherein the forming the implantation mask on the substrate includes forming a photoresist layer on the substrate.

4. The method of claim 1, wherein:
   the implantation mask includes a first opening that exposes the second isolation feature and an N-well active region in the substrate; and
   the ion implantation process uses a p-type dopant.

5. The method of claim 1, wherein:
   the implantation mask includes a first opening that exposes the second isolation feature and a P-well active region in the substrate; and
   the ion implantation process uses an n-type dopant.

6. The method of claim 1, wherein the performing the etching process includes a process selected from the group consisting of:
   etching to pattern a second gate dielectric material layer for I/O circuit;
   etching to remove an implantation screen layer;
   implantation cleaning; and
   combinations thereof.

7. The method of claim 1, wherein the performing the etching process includes performing the etching process using an etch mask covering the second isolation feature and exposing the first isolation feature.

8. The method of claim 1, further comprising:
   forming a dielectric material layer on the substrate;
   forming an etch mask on the dielectric material layer, wherein the etch mask covers the first isolation feature and an active region for I/O circuit; and
   exposes the second isolation feature and an active region for core circuit; and
   performing an etching process to the dielectric material layer through the etch mask.

9. The method of claim 8, wherein:
   the dielectric material layer includes silicon oxide; and
   the etch mask includes a photoresist layer.

10. The method of claim 1, further comprising forming a resistor on the first isolation feature after the performing the etching process to the substrate.

11. The method of claim 10, wherein the forming the resistance resistor on the first isolation feature includes forming a doped polysilicon resistor with high resistance.

12. The method of claim 10, wherein the forming the resistor includes:
   forming a polysilicon layer on the substrate; and
   patterning the polysilicon layer to form a polysilicon resistor on the first isolation feature and a polysilicon gate on an active region.

13. The method of claim 1, wherein:
   the performing the etching process includes etching the first isolation feature with a first etch rate and etching the second isolation feature with a second etch rate greater than the first etch rate.

14. A method of making an integrated circuit, the method comprising:
   forming a first isolation feature having a first width and a second isolation feature having a second width in a semiconductor substrate, the first width being substantially greater than the second width;
   forming a dielectric material layer on the semiconductor substrate;
   forming an etch mask on the dielectric material layer, wherein the etch mask is patterned to cover the first isolation feature and a first active region, and
   to uncover the second isolation feature and a second active region; and
   performing an etching process to the dielectric material layer through the etch mask to reduce a thickness of the second isolation feature.

15. The method of claim 14, wherein:
   the first active region is configured for an input/output (I/O) device; and
   the second active region is configured for a core device.

16. The method of claim 14, wherein:
   the first and second isolation features include silicon oxide; and
   the dielectric material layer includes silicon oxide.

17. The method claim 14, further comprising:
forming an implantation mask on the substrate, wherein the implantation mask covers the first isolation feature and uncovers the second isolation feature; and
performing an ion implantation process to the substrate using the implantation mask.

18. The method of claim 14, further comprising:
forming a polysilicon layer on the substrate; and
patterning the polysilicon layer to form a polysilicon resistor on the first isolation feature and a polysilicon gate on one of the first and second active regions.

* * * * *